United States Patent [19]

Pulliam

[11] Patent Number: 4,478,872

[45] Date of Patent: Oct. 23, 1984

[54] METHOD OF MANUFACTURING A MULTILAYER MAGNETO-OPTIC DEVICE

[75] Inventor: George R. Pulliam, Anaheim, Calif.

[73] Assignee: Litton Systems, Inc., Beverly Hills, Calif.

[21] Appl. No.: 481,914

[22] Filed: Apr. 4, 1983

[51] Int. Cl.³ ............................................. B05D 3/06
[52] U.S. Cl. ................................... 427/38; 427/43.1; 427/53.1; 427/130; 427/131
[58] Field of Search ....................... 427/38, 43.1, 53.1, 427/130, 131

Primary Examiner—Bernard D. Pianalto

[57] ABSTRACT

A method of manufacturing and using a magneto-optic device is provided in which a non-magnetic substrate material is utilized to support a laminate formed of at least two layers of magnetic material having certain magnetic and optical properties optimized in one layer and certain switching properties optimized in another layer. The laminate layers are exchange-coupled at their interface to permit the propagation of a magnetic domain wall through the interface from the switching optimized layer to the optically optimized layer so that the direction of magnetization and Faraday rotation of the entire multi-layer magnetic material laminate can be reversed through application of an applied external magnetic field having a relatively small threshold value. A modified region of decreased anisotropy material is provided within the switching optimized layer to reduce the switching threshold field for the magneto-optic device to a fraction of the low threshold of the magnetic material of the switching optimized layer. The switching optimized layer is made considerably thinner than the optically optimized layer to prevent the inferior optical properties of the switching optimized layer from interfering with the desired optical properties of the magneto-optic device. The entire magneto-optic device may be formed into an array of individual magnetic post elements having electrical conductors placed within the separations between post elements for generating the applied magnetic fields utilized to switch the direction of magnetization of the individual post elements to generate a display.

20 Claims, 3 Drawing Figures

U.S. Patent  Oct. 23, 1984  4,478,872
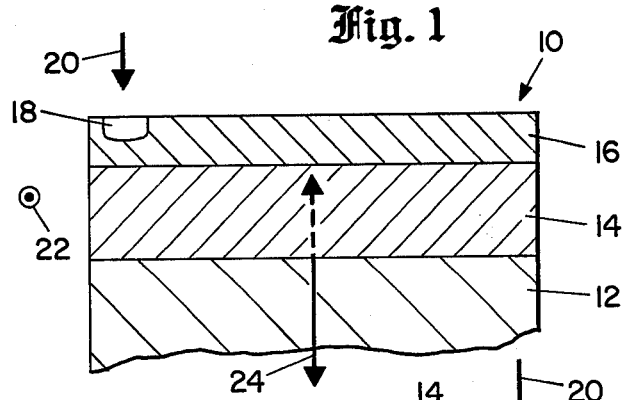
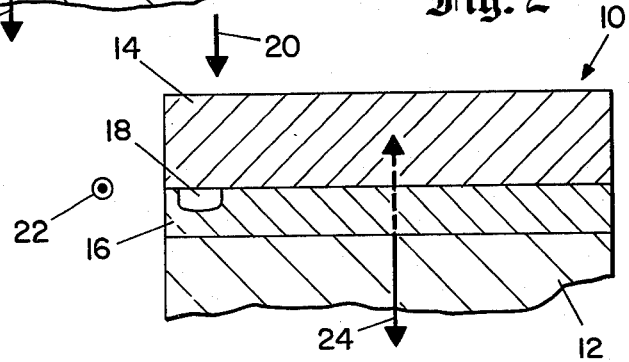
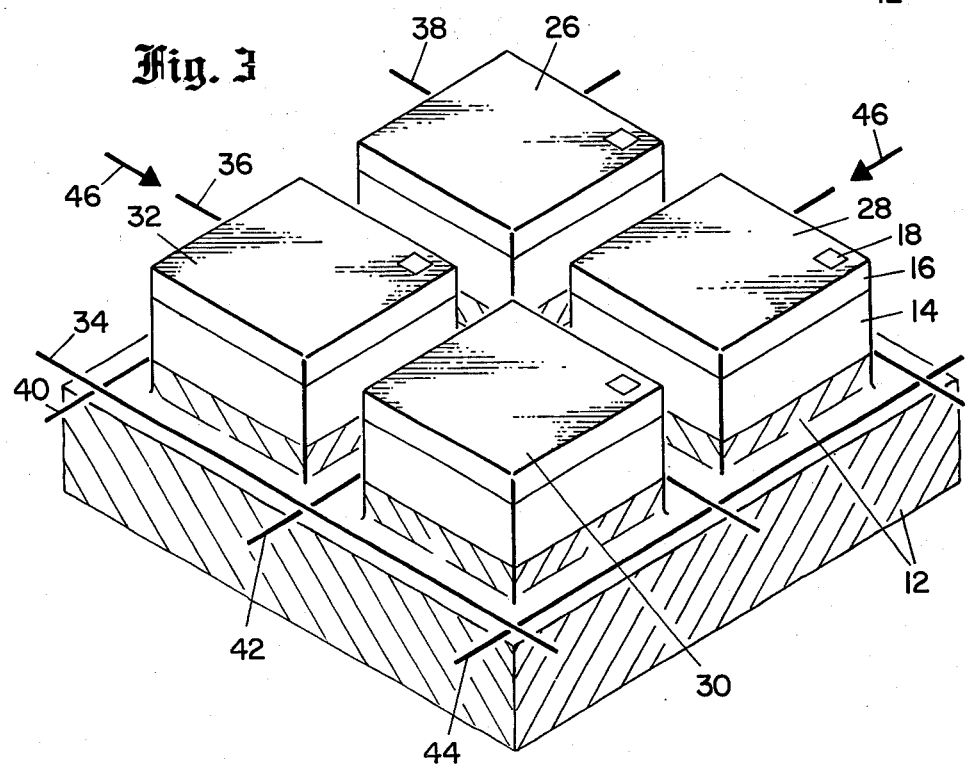

METHOD OF MANUFACTURING A MULTILAYER MAGNETO-OPTIC DEVICE

FIELD OF THE INVENTION

The present invention relates to a method and device for improving the switching properties of magneto-optic chips and displays and, more particularly, to methods of constructing and operating multilayer magneto-optic devices in which optical and magnetic properties are optimized in one layer and switching properties are optimized in another layer.

BACKGROUND OF THE INVENTION

It is well known that the direction of magnetization of a magnetic material can be reversed or switched by impressing an external magnetic field of opposite polarity on the material. Typically, such magnetic material may be placed upon a non-magnetic substrate and then divided or separated into a grid-like pattern to create a display composed of individual magnetic post elements. If the magnetic post elements and the non-magnetic substrate are structured from materials that are transparent to electromagnetic radiation and the magnetic material exhibits the Faraday effect of rotating polarized light, it is possible to create a magneto-optic display by passing polarized light through the transparent element and then through an analyzer. Because reversing the direction of magnetization of the magnetic material also reverses its associated direction of Faraday rotation, it is possible to effectively switch the optical properties of the individual display elements on and off by reversing the direction of magnetization of each post element in response to an externally switched magnetic field. When electric conductors are placed within the separations between the post elements, electric current may be passed through these conductors to generate the magnetic flux about each conductor. When this flux is concentrated at the point of coincidence of two conductors, the concentrated magnetic flux may be used to reverse the direction of magnetization of the post element located at that point to accomplish the switching of the element.

Reversal of the direction of magnetization of the magnetic material within the post element, in response to the imposition of an external magnetic field, occurs at the area which has the lowest value of anisotropy field within that magnetic material. At this low anisotropy field area, a magnetic domain wall, which separates adjacent regions of material where each region has an opposite direction of magnetization, is generated and then propagated through the rest of the magnetic material to complete the switching of the post element. Thus, switching of a post element is composed of an initiating step and a saturation step. To initiate switching of the post element, a magnetic field which exceeds the effective anisotropy field of that area of the post element with the lowest anisotropy must be generated. To complete switching through magnetic field saturation, the domain wall must spread to the farthest reaches of the post element. This will only occur if the magnetic field imposed upon the most distant portion of the post element is higher than the saturation field of the magnetic material forming the element.

Typically, magneto-optic devices are fabricated using bismuth doped liquid phase epitaxial garnet films. The presence of bismuth improves the Faraday rotation of the garnet film which is the principal optical property utilized in such devices. Increasing the bismuth concentration within the garnet film raises both the Faraday rotation and the anisotropy constant of the film. High anisotropy constants yield high anisotropy fields, which, in turn, result in the requirement of higher magnetic switching field thresholds to change the direction of magnetization of the garnet films. Conversely, higher anisotropy constants lead to lower magnetic saturation fields. Thus, it is apparent that desired optical, magnetic, and switching properties of such films cannot be achieved independently of one another and that optimizing one property may harm another property.

It would be desirable to have a magneto-optic device in which these opposing requirements for desired properties could all be optimized. A copending patent application entitled "Altering The Switching Threshold Of A Magnetic Material", filed Nov. 12, 1981, Ser. No. 320,819, which is assigned to the common assignee of the present invention, discloses a method and device for reducing the switching field required to reverse the direction of magnetization in which a region of low anisotropy material is implanted within a high anisotropy material forming a post element. However, there is a practical limitation to this method of switching threshold reduction because increasing the Faraday rotation of such devices through increased bismuth concentrations will also increase the switching thresholds. Thus, the prior art fails to disclose a magneto-optic device in which the desired optical, magnetic, and switching properties can be independently and simultaneously optimized.

Examples of other prior art devices for switching the direction of magnetization of magnetic post elements upon a non-magnetic substrate may be found in U.S. Pat. No. 3,715,736, issued Feb. 6, 1973, and in U.S. Pat. No. 4,114,191, issued Sept. 12, 1978. Another prior art patent which uses an external magnetic field and coincident current selection of post elements in a magneto-optic display may be found in British Pat. No. 1,180,334, published Apr. 5, 1968.

SUMMARY OF THE INVENTION

Accordingly, it is a principal object of the present invention to provide a method of manufacturing and using a magneto-optic device in which optical, magnetic, and switching properties are optimized.

To accomplish this and other objects, there is provided a non-magnetic substrate material upon which is placed a multilayer laminate of magnetic film having certain magnetic and optical properties optimized in one layer and certain switching properties optimized in another layer. The laminate layers are exchange coupled at their interface to permit the propagation of a magnetic domain wall through the interface from the switching optimized layer to the optically optimized layer so that the direction of magnetization of the entire multilayer magnetic material laminate can be reversed or switched through application of a magnetic field having a relatively small threshold value. This small threshold value requirement is achieved by creating a region within the switching optimized layer that is modified to further decrease the anisotropy characteristics of the region relative to the rest of the magnetic material in the switching optimized layer. As a result, the effective switching threshold field for the multilayer magneto-optic post element is reduced to a fraction of the much lower threshold field of the magnetic material of the switching optimized layer rather than that of the much higher switching threshold of the optically optimized layer. Additionally, the switching optimized layer is made considerably thinner than the optically optimized layer so that the inferior optical characteristics of the switching optimized layer will not interfere with the desired optical characteristics of the optically optimized layer and thus of the multilayer magneto-optic device as a whole. In this manner, the present invention provides a magneto-optic device in which desired optical, magnetic, and switching properties can be independently and simultaneously optimized.

BRIEF DESCRIPTION OF THE DRAWINGS

A better understanding of the objects and advantages of the present invention may be had after consideration of the following specification and drawings, in which:

FIG. 1 is a cross-sectional view of a magneto-optic post element that has been manufactured in accord with the method of the present invention;

FIG. 2 is a cross-sectional view of a magneto-optic device illustrating an alternative embodiment of the present invention; and FIG. 3 is a perspective view of a portion of a magneto-optic display element illustrating the principles of the present invention.

DESCRIPTION OF THE PREFERRED EMBODIMENTS

Referring now to FIG. 1, a low switching threshold magneto-optic device is shown at 10. Magneto-optic device 10 is formed in accordance with the method of the present invention and comprises a non-magnetic and optically transparent substrate 12 upon which is deposited a layer of magnetic film 14 upon which is laminated a second, thin layer of magnetic film 16. Film layer 16 is provided with a region 18 in which the magnetic properties of the film have been modified, as will be discussed below. The double layer laminate structure composed of magnetic film layers 14 and 16 provides a magneto-optic device 10 in which desired optical properties are optimized in layer 14 and switching properties are independently optimized in layer 16 having a modified region 18.

Substrate 12 may be formed from a garnet material such as gadolinium gallium garnet. Layers 14 and 16 may be deposited upon substrate 12 by the liquid phase epitaxy method and may be one of several transparent films that demonstrate magnetic domain characteristics. It is preferred that layers 14 and 16 be fabricated using bismuth doped liquid phase epitaxial garnet. However, other dopants may be used within the teachings of the present invention. The presence of bismuth improves the Faraday rotation property of the garnet films which is the principal optical property utilized in magneto-optic devices. Such films may also be created from iron garnet by substituting aluminum or gallium and certain rare earth ions in the iron garnet film. The magnetic films 14 and 16 must be transparent to electromagnetic energies; however, the non-magnetic substrate 12 may be opaque when used in a reflective mode. Additionally, it is preferred that the material of non-magnetic substrate 12 be a $Gd_3Ga_5O_{12}$ based material which may be modified through the addition of divalent or trivalent ions such as Sm, Md, Y, Ca, Sr, or divalent, trivalent, or tetravalent ions such as Mg, Zr, or Sn, because such additions are known to increase the amount of bismuth that can be accommodated in the garnet films supported by the substrate and thus the optical properties of layer 14 and layer 16 may be increased by increasing the bismuth concentration of the garnet films as a result of the increased bismuth support capabilities of the substituted substrate material.

It is known that high amounts of bismuth raise both the Faraday rotation and the anisotropy constant of garnet films. Accordingly, it is preferred that layer 14 use as high a bismuth content as is possible, consistent with good crystal growth, to provide a magneto-optic device with optimal optical characteristics. However, because high anisotropy constants result in the requirement of high magnetic switching fields to change the direction of magnetization of the high anisotropy constant magnetic film when utilizing a magneto-optic device incorporating such films, it is preferred that thin layer 16 contain a much lower amount of bismuth than layer 14 to provide a moderate anisotropy constant in layer 16 and thus a much lower switching threshold, as will be discussed below.

Additionally, it is known that the switching of a single domain magnetic element occurs at the smallest value of anisotropy field within the single domain element. Thus, it is preferred that modified region 18 be provided in layer 16, composed of magnetic film having a relatively low anisotropy constant, such that the magnetic material in region 18 exhibits a reduced anisotropy constant relative to the lower anisotropy constant of the remainder of magnetic material of layer 16. Modified region 18 will thereby lower the effective anisotropy field to a fraction of the anisotropy field of the magnetic material of thin layer 16. Because layer 16 is exchange coupled to laminate layer 14, the domain wall generated by the external magnetic field used to switch the direction of magnetization of low anisotropy region 18 is able to propagate through layer 16 into and through layer 14. As a result, the effective switching threshold for magneto-optic device 10 is a fraction of the much smaller anisotropy field of thin layer 16, rather than that of the much higher anisotropy field of layer 14. In this manner, the present invention provides a magneto-optic device having both the desired characteristics of high Faraday rotation and low switching threshold values; each characteristic being optimized in a separate layer of magnetic film laminated upon a non-magnetic substrate. It should be noted that care must be taken to make the transition between layers 14 and 16 a gradual one so that propagation of the magnetic domain wall during switching will not be hampered.

As shown in FIGS. 1 and 2, thin layer 16 has a considerably smaller cross-section than layer 14. As a result, the inferior optical qualities of layer 16, due to its relatively low bismuth content, will have a negligible effect of the superior optical performance of layer 14. Along these lines, it is preferred that layer 16 be on the order of 1.5 micrometers or less in thickness. Conversely, the thickness of layer 14 is a more flexible parameter and may be determined in accordance with the optical characteristics desired, principally the degree of Faraday rotation exhibited by the film.

Region 18 is preferably modified through the use of ion implantation techniques to reduce the anisotropy constant of the magnetic material within modified region 18. However, it is contemplated that laser beam annealing or electron beam annealing may also be used for this purpose.

In practice, the direction of magnetization of magneto-optic device 10, as indicated by dotted arrow 24, is switched or reversed through the application of an applied magnetic field, represented by arrow 20, generated by source 22, in this embodiment a conducting wire or strip through which an electric current is sent, upon the magnetic material of region 18. For purposes of explanation, the applied magnetic field 20 is generated in accordance with the right-hand rule such that the current flowing through source 22 can be thought of as flowing into the plane of FIGS. 1 and 2, thereby generating an applied magnetic field in the direction of arrow 20. Application of magnetic field 20 reverses the direction of magnetization within modified region 18, generating a domain wall (not shown) which then propagates through the magnetic material of layer 16 and exchange coupled layer 14 as a result of the continued application of magnetic field 20. The switching process will be completed, as indicated by solid arrow 24, if the domain wall is able to propagate throughout the entire volume of layers 16 and 14. For such magnetic field saturation to occur, the areas of layers 16 and 14 farthest away from source 22 must be subjected to a magnetic field which is above the saturation field of the film layers. In this regard, the present invention provides a further advantage to switching of magneto-optic device 10 through optimization of the magnetic properties of layers 14 and 16 in conjunction with one another. As discussed above, layer 14, having high anisotropy also has a low magnetic saturation field. As a result, layer 14 can be saturated at a comparatively low value of magnetic field, lower than layer 16. The field from saturated layer 14 will then add to the applied field 20 to aid in completing the saturation and switching of the magnetic field of layer 16, which, due to its lower anisotropy, has a relatively high saturation value. As a result, of the complimentary saturation properties of exchange coupled layers 14 and 16, it is possible to complete switching the direction of magnetization of the laminated layers with a significantly reduced applied magnetic field, thereby enabling the electric current flowing through source 22 to be reduced accordingly.

As shown in FIG. 2, the position of thin layer 16 relative to substrate 12 can be varied in accordance with the teachings of the present invention. While it is preferred that layer 16 be positioned on top of layer 14 as shown in FIG. 1, it is contemplated that layer 16 may be placed adjacent to substrate 12 as shown in FIG. 2. The effect of the inferior optical properties of layer 16, as discussed with reference to FIG. 1, is reduced due to the fact that layer 16 is considerably thinner than the higher quality optical property layer 14. It will be appreciated that the two layers may be epitaxially grown in two steps using different compositions in the melt and different growth conditions in each case to vary the composition of the magnetic material in each layer. It should be noted that positioning layer 16 adjacent to substrate 12 will necessitate the modification of region 18 before layer 14 is added to the laminate structure of device 10. In the alternative embodiment of FIG. 2, the modification of region 18 would be performed before the growth of layer 14. Conversely, in FIG. 1 the modification of region 18 is contemplated as being the last step in the manufacture of magneto-optic device 10. As shown in FIG. 2, a benefit of the positioning of thin layer 16 directly adjacent to substrate 12 is the favorable positioning of modified region 18 with respect to source 22. However, in practice source 22 may be considerably larger than shown in FIGS. 1 and 2 or positioned in various locations with respect to modified region 18.

Referring now to FIG. 3, a preferred embodiment of the present invention is shown wherein the double layer film laminate of FIG. 1, having thin layer 16 located on top, has been processed into a pattern of individual post elements, indicated by reference numerals 26, 28, 30, and 32. It is contemplated that the film laminate can be grown into this pattern of separations or deposited across the full surface of substrate 12 and then separated into the grid-like pattern by removal of laminate material through various methods including chemical etching, mechanical milling or ion beam milling. In practice, actual removal need not occur as the magnetic film layers 14 and 16 may be separated into individual post elements by rendering the material between the post elements non-magnetic through ion beam implantation. The patterns established by the removal of the film layers may be varied; however, in the preferred embodiment, the pattern is an orthogonal, grate-like pattern which separates the film layers into a plurality of magnetic post elements formed as quadrilaterals or squares.

Row conductors 34, 36, and 38 and column conductors 40, 42, and 44 are positioned in the separations between the post elements for generating the applied magnetic fields utilized to switch the direction of magnetization of the individual post elements. As shown in FIG. 3, modified region 18 in thin layer 16 is positioned at a point near the periphery of each post element such that region 18 of each post element is near the intersection of a corresponding pair of row and column conductors. The row and column conductors permit the application of a switching magnetic field to the individual magnetic post elements through coincident current selection of a conductor line pair that includes the selected island. For example, to switch the direction of magnetization in the lower left post element 32, current, flowing in the direction indicated by arrows 46, would be passed through row conductor 36 and column conductor 42 such that the coincident currents in conductors 36 and 42 generate magnetic fields according to the right-hand rule which combine at modified region 18 of post element 32 to cause the effective anisotropy field of region 18 to be exceeded, thereby initiating the switching of post element 32 through generation of a domain wall (not shown) in region 18 of element 32. Continued application of the combined magnetic field produced by the coincident currents will complete the switching of the magnetic field of post element 32 through the propagation of a domain wall from region 18 through layers 16 and 14. As discussed above, magnetic field saturation of layer 14, having a low saturation field value due to its high anisotropy constant, will occur first enabling the magnetic field of saturated layer 14 to add to the applied switching magnetic field of the coincident currents to aid in the saturation of thin layer 16 to complete the switching of the film laminate structure of post element 32. Thus, the direction of magnetization of post element 32 can be reversed independently of the other post elements and vice versa, allowing a pattern of transmitted or reflected polarized light to be generated by selectively reversing the direction of magnetization and thus the direction of Faraday rotation of various combinations of post elements. From the foregoing it can been seen that the present invention, by optimizing both optical and switching properties, provides a magneto-optic device in which desired optical properties may be achieved with low switching currents.

What is claimed is:

1. A method for raising the anisotropy and Faraday rotation of a magneto-optic device while reducing the threshold of a magnetic field required to switch the direction of magnetization in said device, said method comprising the steps of:

forming a laminate composed of at least one layer of magnetic material having high anisotropy in juxtaposition with at least one layer of magnetic material having low anisotropy;

providing said low anisotropy material layer with a region of magnetic material that has been modified to further decrease the anisotropy of said region relative to the anisotropy of the remainder of said low anisotropy material layer; and supporting said laminate upon a non-magnetic substrate.

2. The method of claim 1, wherein said laminate is structured by epitaxially growing said laminate layers upon said non-magnetic substrate.

3. The method of claim 1, wherein said layer of magnetic material having high anisotropy is positioned between said non-magnetic substrate and said layer of magnetic material having low anisotropy.

4. The method of claim 1, wherein said layer of magnetic material having low anisotropy is positioned between said non-magnetic substrate and said layer of magnetic material having high anisotropy.

5. The method of claim 1, wherein said layer of magnetic material having low anisotropy is formed to have a thin cross-section relative to the cross-section of said layer of magnetic material having high anisotropy.

6. The method of claim 5, wherein said layer of magnetic material having low anisotropy is structured to be on the order of 1.5 micrometers in thickness.

7. The method of claim 5, wherein said layer of magnetic material having high anisotropy is formed to be of sufficient thickness to exhibit optimal Faraday rotation and magnetic saturation field characteristics.

8. The method of claim 1, wherein said modified region having decreased anisotropy is modified through laser or electron beam annealing.

9. The method of claim 1, wherein said modified region having decreased anisotropy is modified through ion implantation.

10. The method of claim 1, wherein said substrate is a garnet based material and said laminate is formed of layers of bismuth doped garnet film.

11. The method of claim 1, wherein:

said laminate defines at least one isolated post element upon said substrate; and said region of modified material is located by altering a peripheral area of said isolated post element.

12. The method of claim 11, wherein said laminate is structured by epitaxially growing said laminate layers upon said non-magnetic substrate.

13. The method of claim 11, wherein said layer of magnetic material having high anisotropy is positioned between said non-magnetic substrate and said layer of magnetic material having low anisotropy.

14. The method of claim 11, wherein said layer of magnetic material having low anisotropy is positioned between said non-magnetic substrate and said layer of magnetic material having high anisotropy.

15. The method of claim 11, wherein said layer of magnetic material having low anisotropy is formed to have a thin cross-section relative to the cross-section of said layer of magnetic material having high anisotropy.

16. The method of claim 15, wherein said layer of magnetic material having low anisotropy is structured to be on the order of 1.5 micrometers in thickness.

17. The method of claim 15, wherein said layer of magnetic material having high anisotropy is formed to be of sufficient thickness to exhibit optimal Faraday rotation and magnetic saturation field characteristics.

18. The method of claim 11, wherein said modified region having decreased anisotropy is modified through laser or electron beam annealing.

19. The method of claim 11, wherein said modified region having decreased anisotropy is modified through ion implantation.

20. The method of claim 11, wherein said substrate is a garnet based material and said laminate is formed of layers of bismuth doped garnet film.

* * * * *